United States Patent
Licausi et al.

(10) Patent No.: US 10,770,392 B1
(45) Date of Patent: Sep. 8, 2020

(54) LINE END STRUCTURES FOR SEMICONDUCTOR DEVICES

(71) Applicant: GLOBALFOUNDRIES INC., Grand Cayman (KY)

(72) Inventors: Nicholas V. Licausi, Watervliet, NY (US); Shao Beng Law, Watervliet, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/393,973

(22) Filed: Apr. 25, 2019

(51) Int. Cl.
*H01L 23/522* (2006.01)
*H01L 23/528* (2006.01)
*H01L 21/768* (2006.01)

(52) U.S. Cl.
CPC ...... *H01L 23/5226* (2013.01); *H01L 21/7685* (2013.01); *H01L 21/76802* (2013.01); *H01L 21/76877* (2013.01); *H01L 23/528* (2013.01)

(58) Field of Classification Search
CPC ............. H01L 23/5226; H01L 21/7685; H01L 21/76877; H01L 23/528; H01L 21/76802
See application file for complete search history.

(56) References Cited

U.S. PATENT DOCUMENTS

| 5,663,101 A | 9/1997 | Cronin |
| 9,793,156 B1 | 10/2017 | Yang |
| 2007/0205507 A1* | 9/2007 | Chang ............... H01L 21/76832 257/734 |
| 2017/0125353 A1* | 5/2017 | Chen ................. H01L 21/76816 |

* cited by examiner

*Primary Examiner* — Karen Kusumakar
(74) *Attorney, Agent, or Firm* — David Cain

(57) ABSTRACT

A method of fabricating a semiconductor device structure comprising depositing a layer of material on a dielectric stack and patterning the layer of material to form a hard mask, depositing a metal layer covering the hard mask to form a metal hard mask, forming vias in the dielectric stack using the metal hard mask, removing the metal hard mask, and forming trenches in the dielectric stack using the hard mask, wherein the hard mask and the metal hard mask are used to define a line end structure separating the trenches.

20 Claims, 10 Drawing Sheets

LINE END STRUCTURES FOR SEMICONDUCTOR DEVICES

FIELD OF THE INVENTION

The present disclosure relates to semiconductor devices and the manufacturing thereof, and more specifically, to the use and fabrication of line end structures for semiconductor devices.

BACKGROUND

Interconnects are used extensively in semiconductor devices and they typically comprise conductive lines with interconnect vias connecting several metallization levels. A major design concern preventing interconnect scaling and producing uniform conductive lines is the ability to fabricate interconnect vias near conductive line ends. Reducing the minimum distance between line ends for two separate conductive lines is advantageous for scaling and routing. The via-to-line overlay and critical dimension uniformity (CDU) limit how close interconnect vias may be placed near conductive line ends, which is a barrier to scaling.

With respect to interconnect vias formed near conductive line ends, it is essential to minimize both via center to via center spacing and distance between line ends for scaling. It is also important to maintain an offset distance between interconnect vias and conductive line ends, i.e., line end extensions. Line end extensions may provide a copper (Cu) supply to mitigate electromigration reliability concerns. The Cu supply in line end extensions may prevent voids from forming within conductive lines when an electrical current flows through the device. Accordingly, line end structures need to have the appropriate design and must be manufactured to address these concerns.

SUMMARY

In an aspect of the present disclosure, there is provided a method of fabricating a semiconductor device structure comprising depositing a layer of material on a dielectric stack and patterning the layer of material to form a hard mask, depositing a metal layer covering the hard mask to form a metal hard mask, forming vias in the dielectric stack using the metal hard mask, removing the metal hard mask, and forming trenches in the dielectric stack using the hard mask, wherein the metal hard mask and the hard mask are used to define a line end structure separating the trenches.

In another embodiment, there is provided a method of fabricating a semiconductor device structure comprising forming a dielectric stack, depositing a layer of masking material on the dielectric stack and patterning the masking material to form a hard mask, selectively depositing a metal layer covering the hard mask to form a metal hard mask, forming two vias in the dielectric stack using the metal hard mask, removing the metal hard mask, and forming two trenches in the dielectric stack using the hard mask, wherein the metal hard mask and the hard mask are used to define a line end structure separating the two trenches.

In another aspect of the present disclosure, there is provided a semiconductor device structure comprising a plurality of conductive lines and interconnect vias formed in a dielectric layer having a patterned line end structure, the line end structure having an upper and lower sections, wherein the upper section is narrower than the lower section, a first and second conductive lines separated by the upper section of the line end structure, and a first and second interconnect vias separated by the lower section of the line end structure, the first and second interconnect vias having a height determined by the lower section.

BRIEF DESCRIPTION OF THE DRAWINGS

The present disclosure may be understood by reference to the following description taking in conjunction with the accompanying drawings.

Figure 1A:
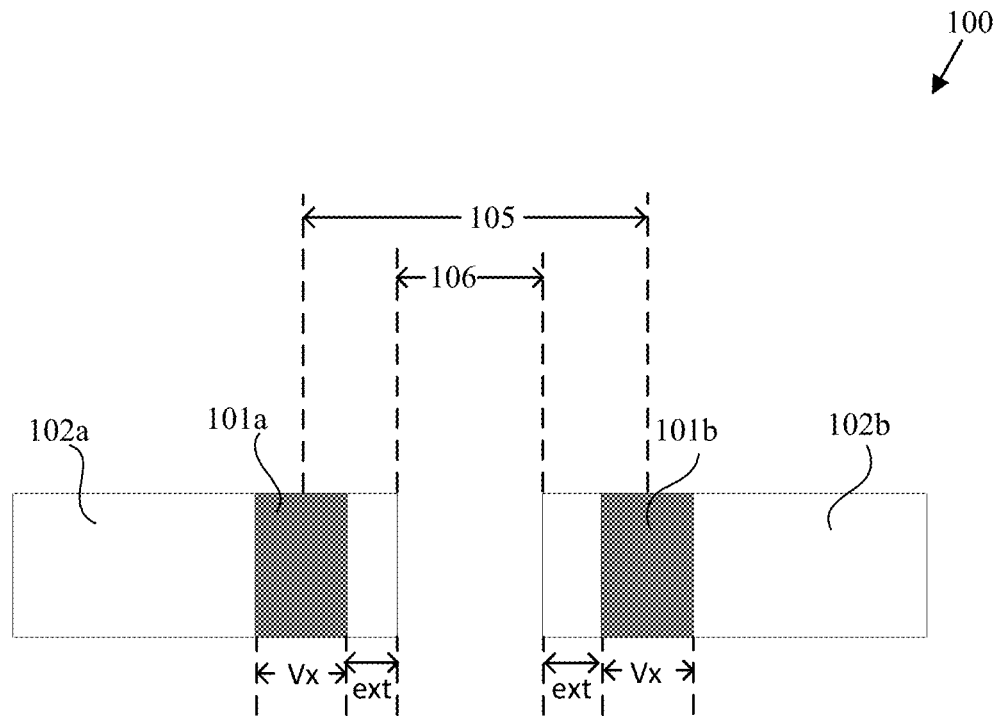
FIG. 1A is a top down view of conductive lines with interconnect vias formed near two line ends.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

The methods provided in the present disclosure advantageously overcome challenges to minimize via center to via center spacing for interconnect vias formed near the ends of conductive lines and the distance between line ends of the conductive lines. The methods also enable the repeatable, uniform and self-aligned formation of line end extensions. A line end extension is a portion of a conductive line extending past an interconnect via. In particular, a forty percent (40%) reduction of via center to via center spacing, e.g., from 20 nm to 12 nm, may be achievable, while maintaining substantially equal line end extensions. The Cu metal in the line end extensions acts as a Cu reservoir to mitigate electromigration reliability concerns.

A top down view of interconnect vias formed near conductive line ends is shown in FIG. 1A. The semiconductor device 100 includes interconnect vias 101a and 101b, two conductive lines 102a and 102b. A via center to via center spacing 105 includes via width (Vx), a line to line end distance 106 and line end extensions (ext).

Figure 1B:
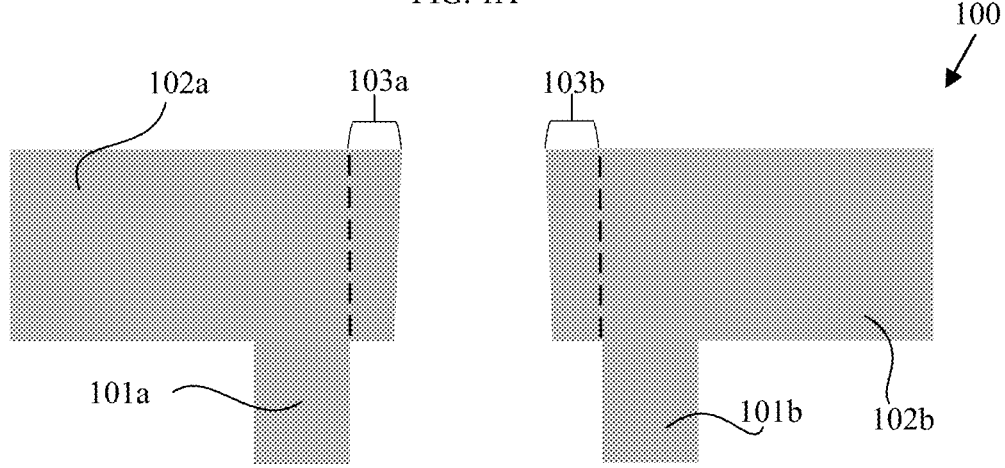
FIG. 1B is a cross-sectional view of the conductive lines and interconnect vias of FIG. 1A.

In FIG. 1B, a cross sectional view of the interconnect vias 101a and 101b and conductive lines 102a and 102b are shown. The line end extensions 103a and 103b facilitate a uniform barrier metal deposition and metal fill process that are typically used to form conductive lines and interconnect vias.

Figure 2A:
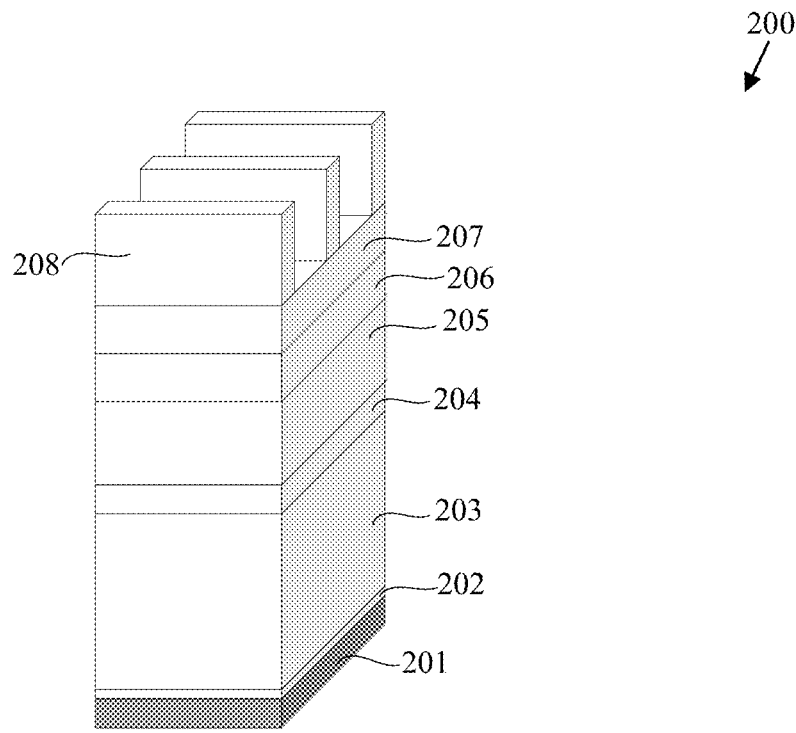
FIGS. 2A-2O illustrate a fabrication process flow for a semiconductor device structure in accordance with embodiments of the present disclosure.

Referring to FIG. 2A, a perspective view of a partially completed embodiment of the present disclosure is shown. The semiconductor device structure 200 includes a metallization layer or transistor layer 201 with an etch stop layer 202 deposited on the metallization layer or transistor layer 201, an interlayer dielectric 203 deposited on the etch stop layer 202, a sacrificial silicon nitride hard mask 204 deposited on the interlayer dielectric 203, a metallization mask layer 205 deposited on the silicon nitride hard mask 204, a planarizing mask layer 206, a silicon-containing anti-reflective coating (SiARC) or bottom anti-reflective coating (BARC) layer 207 and a patterned photoresist layer 208.

In accordance with the present disclosure, layer 201 refers to a metallization layer or transistor layer. A metallization layer or layers includes conductive lines and interconnect vias. A transistor layer includes a semiconductor substrate with transistors or other devices. In some embodiments, semiconductor substrate may include silicon, other elementary semiconductor material such as germanium, or a compound semiconductor. The compound semiconductor may include silicon carbide, gallium arsenide, indium arsenide, indium phosphide, another suitable compound semiconductor, or a combination thereof. The semiconductor substrate may also include a semiconductor-on-insulator (SOI) substrate. The SOI substrate may be fabricated by a separation by implantation of oxygen (SIMOX) process, a wafer bonding process, another applicable method, or a combination thereof.

In addition, the interlayer dielectric (ILD) 203 may be made of silicon oxide, silicon oxynitride, borosilicate glass (BSG), phosphoric silicate glass (PSG), fluorinated silicate glass (FSG), low dielectric constant (low-k) material, another suitable material or a combination thereof. In some embodiments, the interlayer dielectric 203 includes multiple sub-layers. The metallization mask layer 205 may be made of TiN.

Figure 2B:
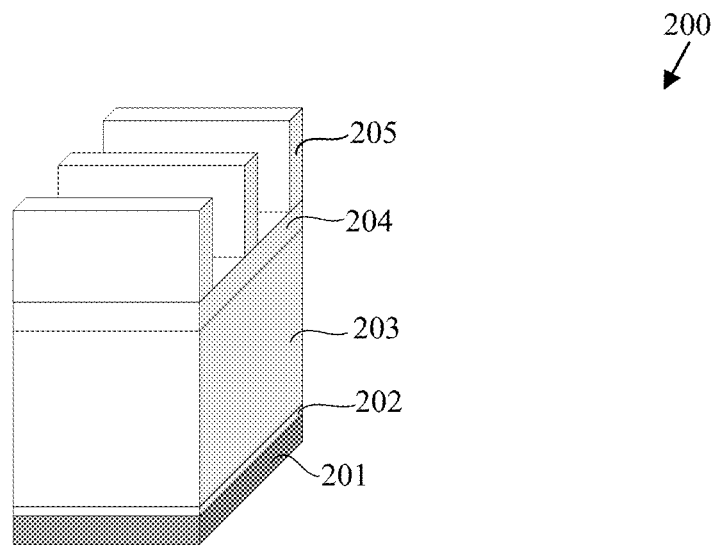

Referring to FIG. 2B, the patterned photoresist layer 208, SiARC or BARC layer 207, planarizing mask layer 206 and metallization mask layer 205 are etched by a reactive ion etching (ME) process. The photoresist layer 208, SiARC or BARC layer 207 and planarizing mask layer 206 are removed during the etching process. The metallization mask layer 205 may be etched with a plasma based reactive ion etch to form a plurality of patterning lines which are subsequently used for etching the interlayer dielectric 203 to form trenches for the semiconductor device structure 200.

Figure 2C:
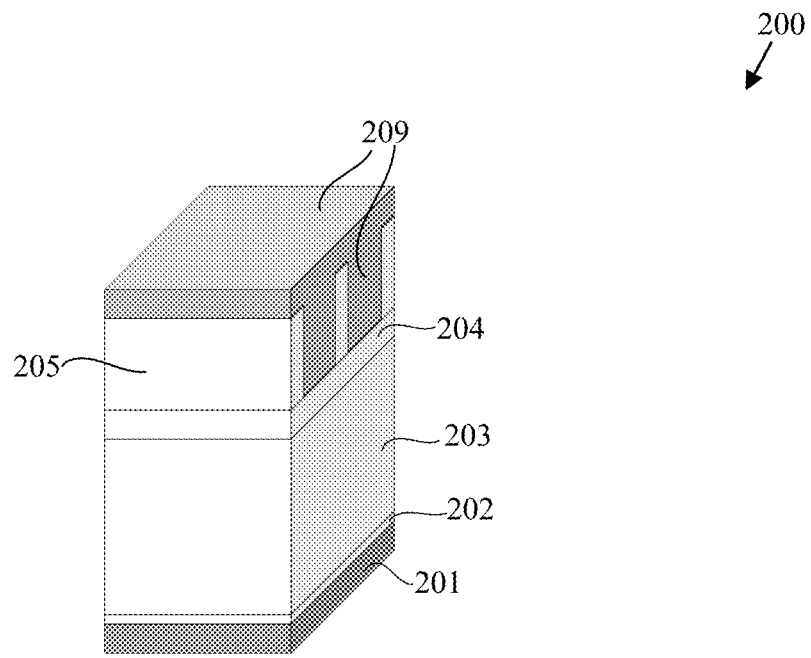

Referring to FIG. 2C, a gap fill layer 209 is deposited on the silicon nitride hard mask 204 and the metallization mask layer 205. The gap fill layer 209 may be formed from spin on carbon or flowable chemical vapor deposition (FCVD) oxide. The gap fill layer 209 fills up the cavities in between the patterning lines of the metallization mask layer 205 to form a planar or semi-planar surface for the subsequent layer deposition.

Figure 2D:
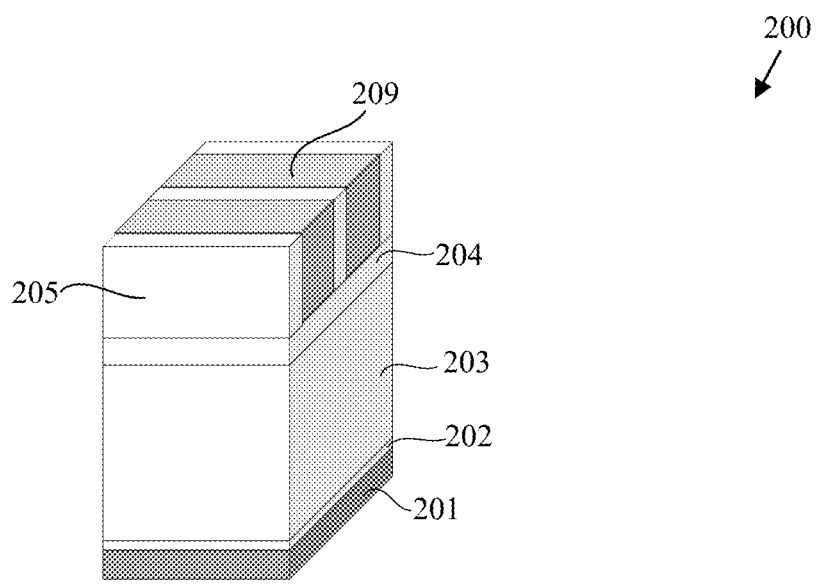

Referring to FIG. 2D, the gap fill layer 209 may be planarized by a suitable process, including a chemical mechanical polishing (CMP) process.

Figure 2E:
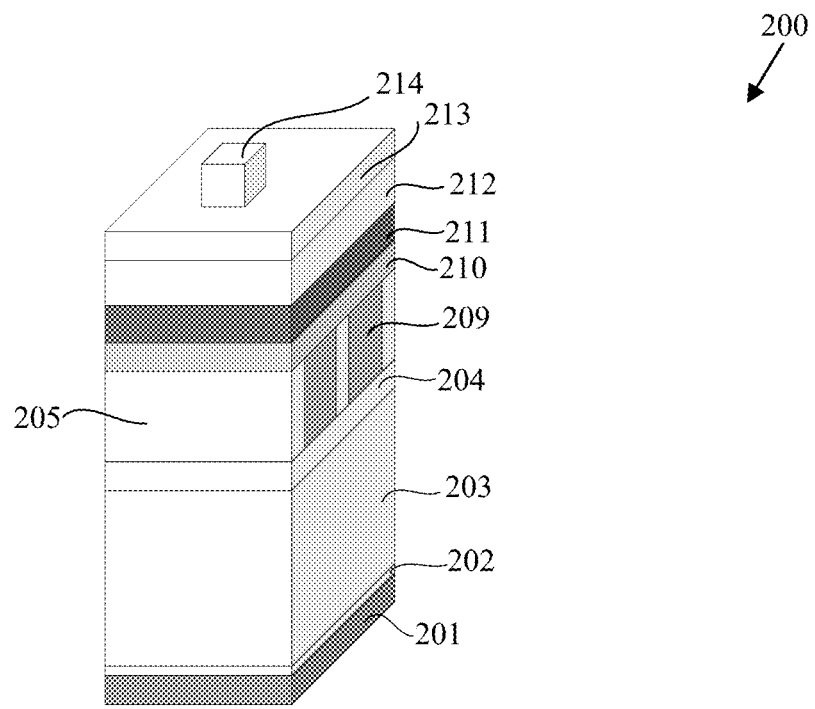

Referring to FIG. 2E, a perspective view of a partially completed embodiment of the present disclosure is provided after additional process steps have been performed. As shown in the figure, an etch stop, like silicon nitride or silicon oxide, layer 210 may be deposited on the gap fill layer 209. A layer of material 211 may be further deposited on the etch stop layer 210, followed by a planarizing mask layer 212, a SiARC or BARC layer 213 and a photoresist layer 214. In accordance with the present disclosure, the layer of material 211 may be made of suitable metal nitride material candidates such as TiN or other suitable metal nitrides. Other material candidates that may be considered are metal oxides such as $TiO_x$, wherein x is a number from 1 to 3. The photoresist layer 214 undergoes conventional photolithographic exposure and developing, consistent with prior art practices.

The etch stop layer 210, the interlayer dielectric 203 and the sacrificial silicon nitride hard mask 204 may be deposited by a suitable process, including chemical vapor deposition (CVD) process, an atomic layer deposition (ALD) process, physical vapor deposition (PVD), a spin-on process, or a combination thereof.

The TiN layer 211 may be deposited by electroplating, CVD, physical vapor deposition (PVD), ALD, another suitable process, or a combination thereof.

Figure 2F:
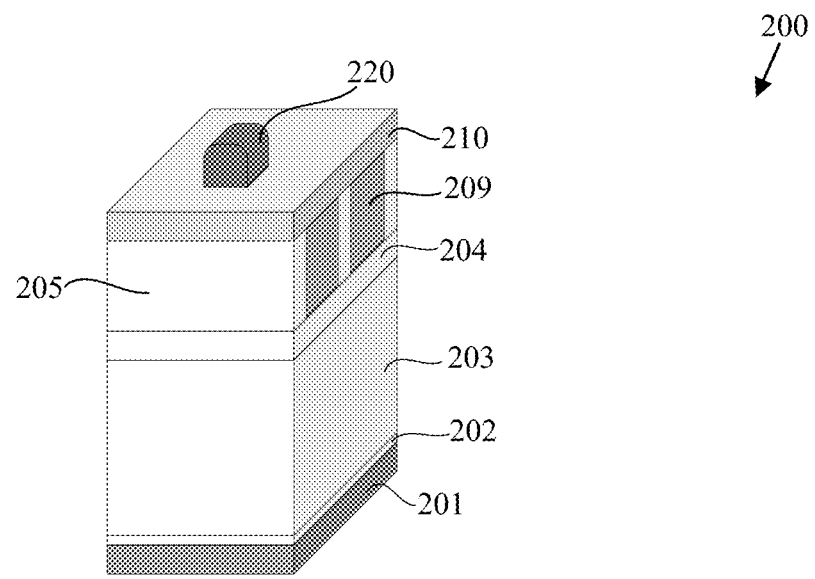

Referring to FIG. 2F, the photoresist layer 214, the SiARC or BARC layer 213, the planarizing mask layer 212 and the TiN layer 211 are etched by a ME process to form a TiN hard mask 220. The photoresist layer 214, the SiARC or BARC layer 213 and the planarizing mask layer 212 are removed during the etching process.

Photolithography reticles may be used during photoresist patterning. The reticles may have alignment marks to enable alignment of different layers. The TiN hard mask 220 is perpendicularly aligned with and abridges at least two of the patterning lines of the metallization mask layer 205 by aligning the alignment marks of the respective photolithography reticles during patterning for the different photoresist layers, 214 and 208, respectively.

Figures 2G, 2H:
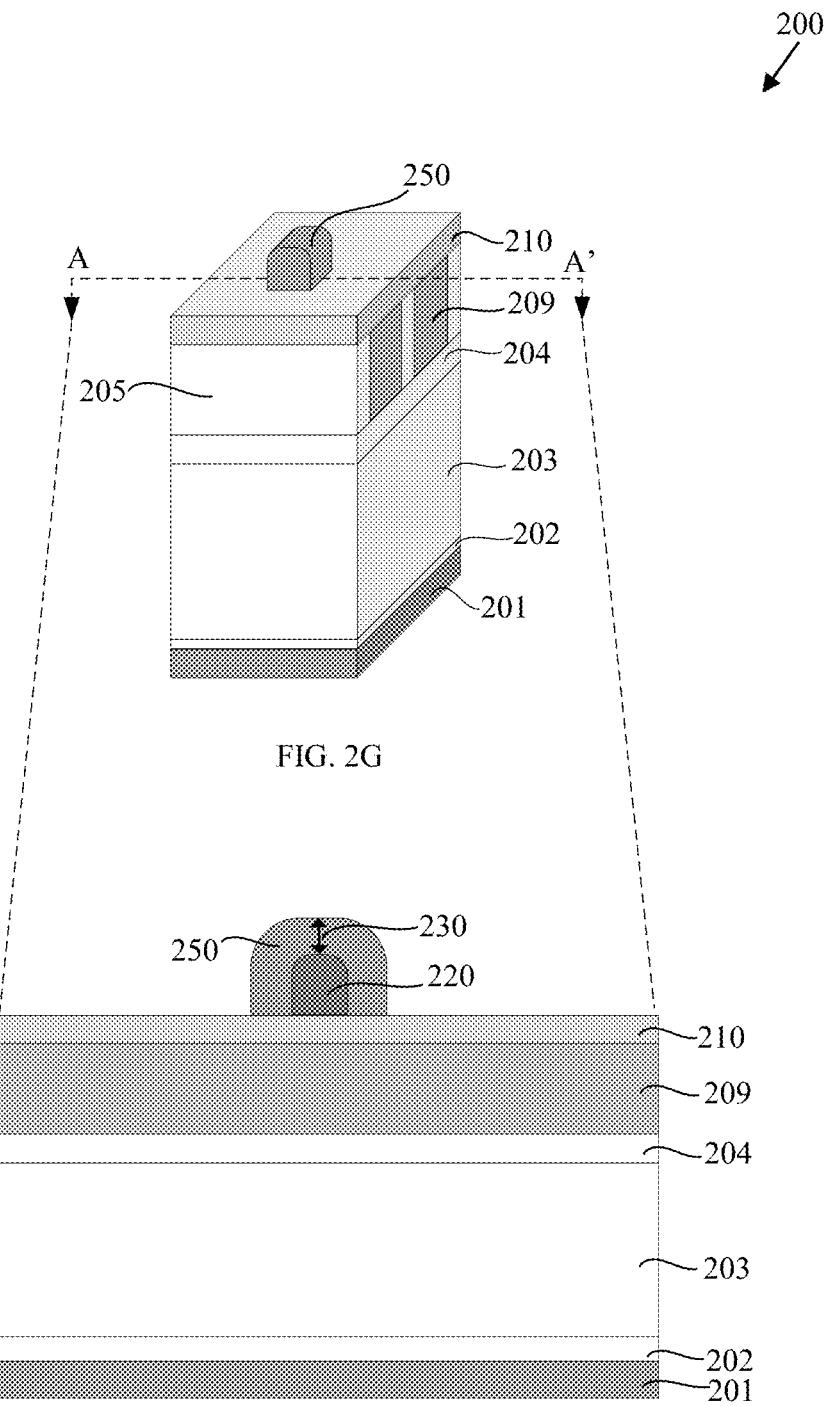

Referring to FIG. 2G, a metal layer may be selectively and conformally deposited on the TiN hard mask 220 to form a metal hard mask 250. In accordance with the present disclosure, the metal hard mask 250 may be made of a suitable metal such as Co. Another material candidate that may be considered is Ru. Deposition can be completed with a selective chemical vapor deposition process, electroless plating or selective atomic layer deposition (ALD). As shown in the figure, the Co hard mask 250 is covering the sidewalls and the top surface of the TiN hard mask 220.

FIG. 2H is a cross-sectional view of the embodiment of the present disclosure along line A-A' shown in FIG. 2G. Due to the conformal deposition process, the Co hard mask 250 thickness 230 at the sidewalls and the top surface of the TiN hard mask 220 is substantially uniform. It is preferred that the thickness of the deposited Co layer to be in between 2 nm to 10 nm. In addition, as the Co layer is selectively deposited on the TiN hard mask 220, the Co layer is only deposited on the surfaces of the TiN hard mask 220 and not on any other areas of the structure.

Figure 2I:
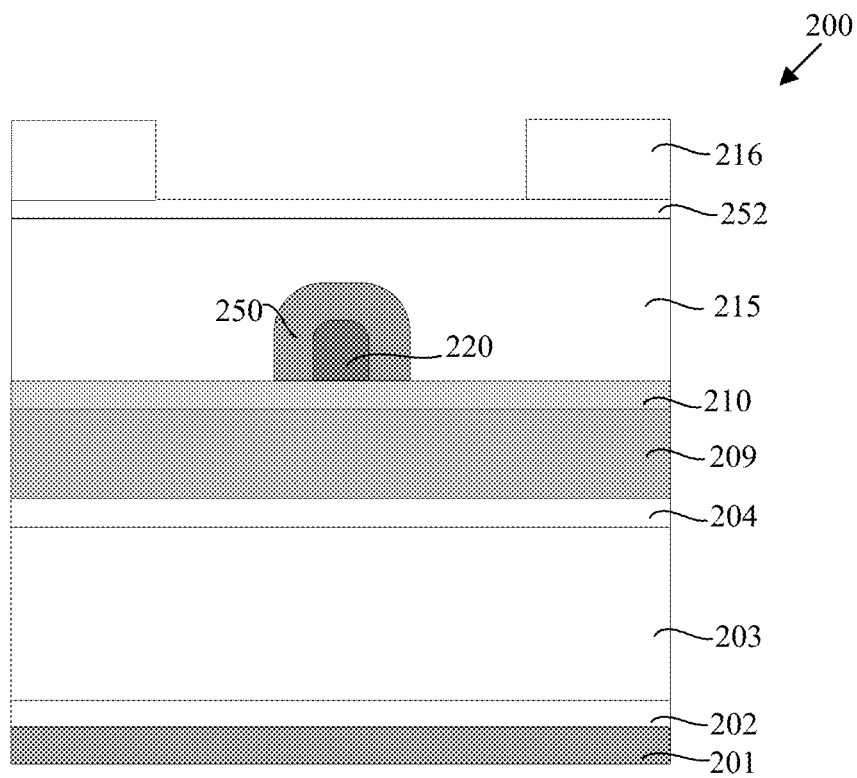

Referring to FIG. 2I, a planarizing mask layer 215, a SiARC or BARC layer 252 and a photoresist layer 216 is deposited on the semiconductor device structure 200. The photoresist layer 216 is processed to form a photoresist pattern for subsequent via etching. The planarizing mask layer 215 may be an organic planarizing mask layer or a spin-on hard mask.

Figure 2J:
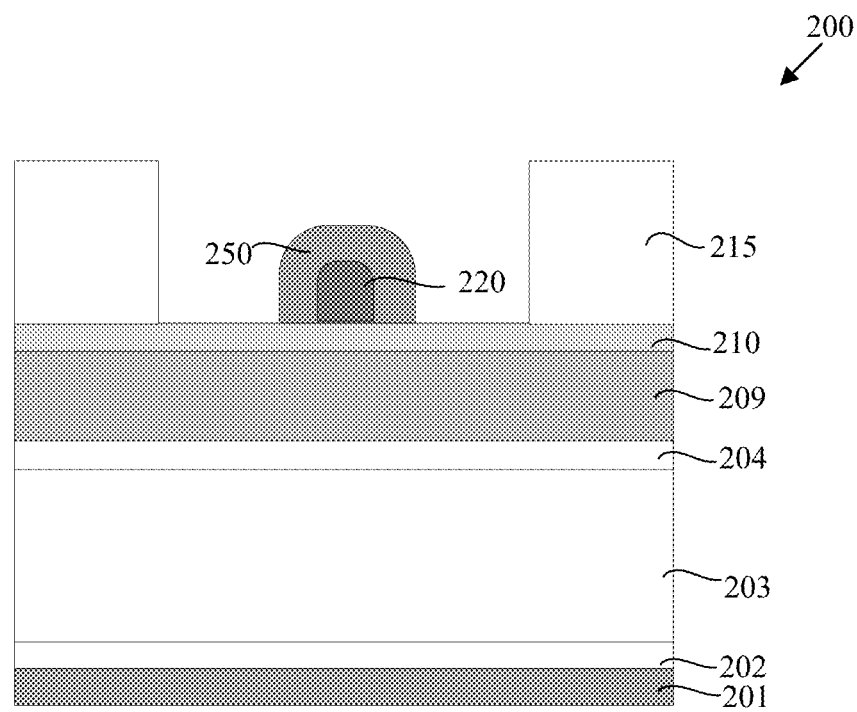

Referring to FIG. 2J, the planarizing mask layer 215, SiARC or BARC layer 252 and the photoresist layer 216 are etched by a ME process to pattern the planarizing mask layer 215. The photoresist layer 216 and the SiARC or BARC layer 252 are removed as part of the etching process.

Figure 2K:
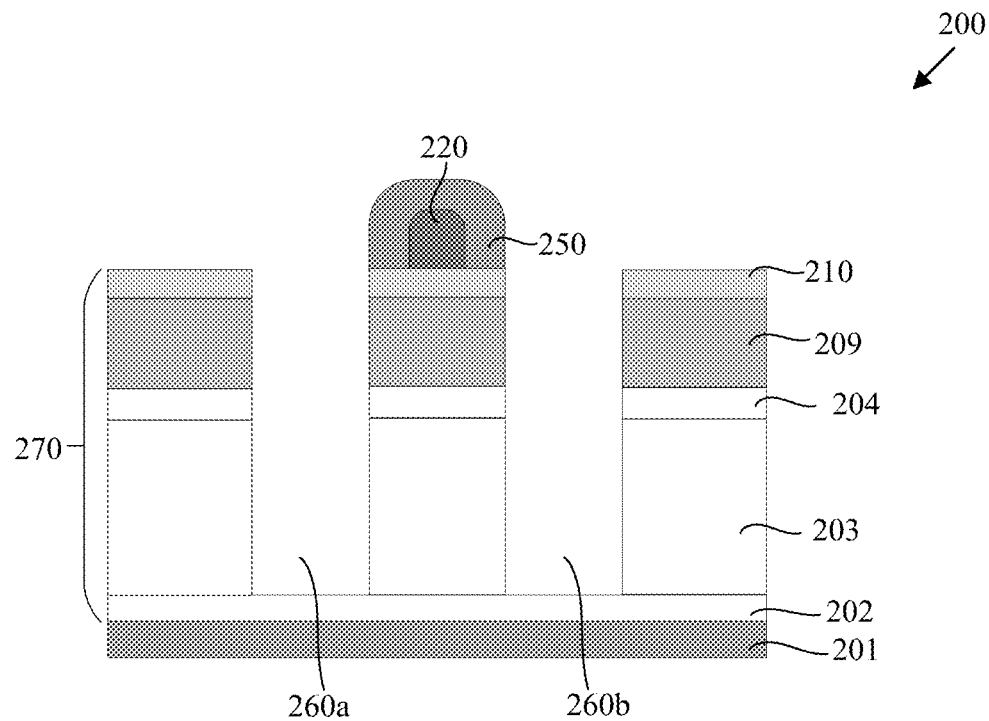

Referring to FIG. 2K, the patterned planarizing mask layer 215 and the Co hard mask 250 may be used to form vias 260a and 260b in a dielectric stack 270 by a ME process. The etching process for the vias 260a and 260b stops at the etch stop layer 202. The planarizing mask layer 215 is removed after via etching process.

Figure 2L:
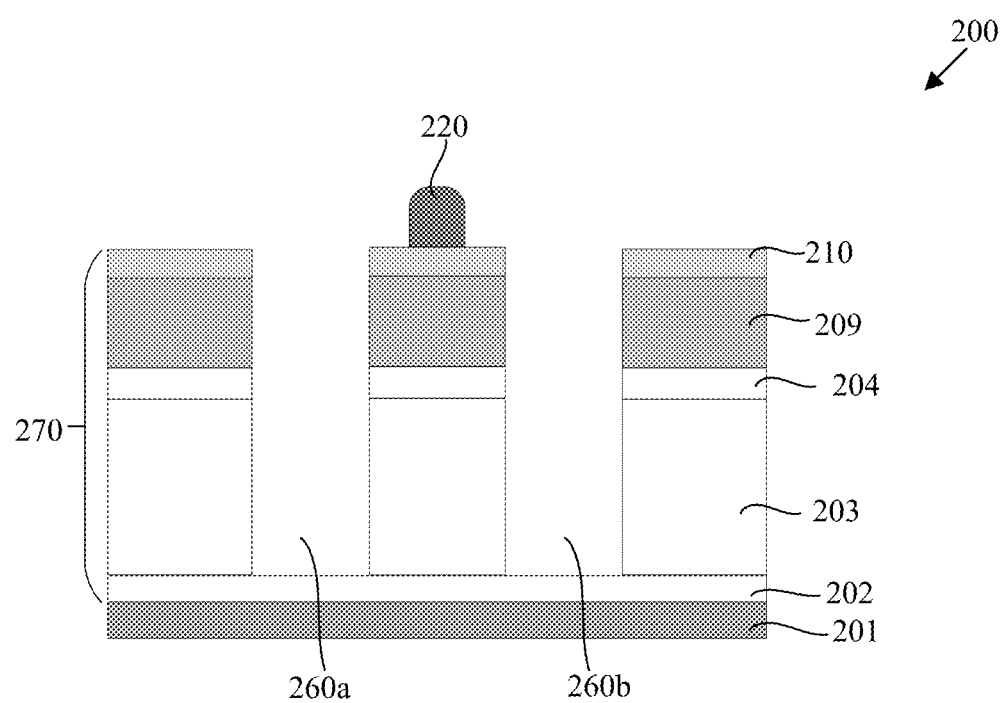

Referring to FIG. 2L, the Co hard mask 250 may be selectively removed by a RIE process or a wet chemical etching process to leave behind the TiN hard mask 220.

Figure 2M:
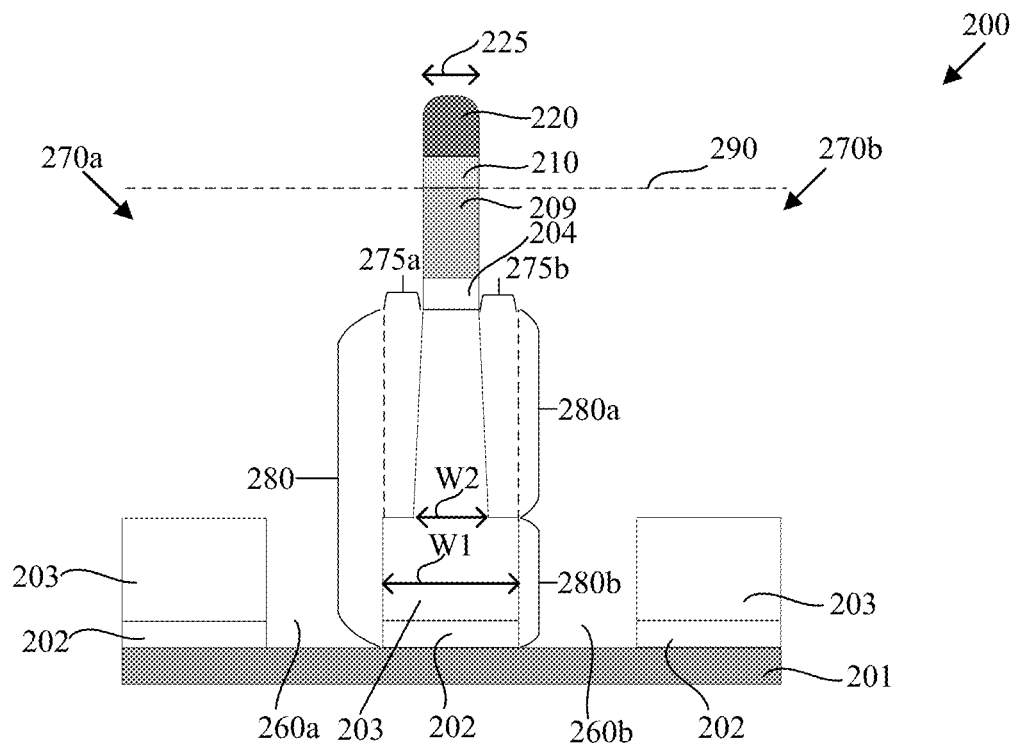

Referring to FIG. 2M, two trenches 270a and 270b are formed in the semiconductor device structure 200 using the TiN hard mask 220 to define a self-aligned line end structure 280 separating the two trenches. The line end structure 280 is formed in the interlayer dielectric 203. Hence, the Co hard mask 250 forms a lower section of the line end structure 280b with a predetermined width W1 during the forming of the vias 260a and 260b. The TiN hard mask 220 forms an upper section of the line end structure 280a with a predetermined width W2 during the forming of the trenches 270a and 270b. Width W2 may be narrower than width W1.

Although not shown, the metallization mask layer 205 is used together with the TiN hard mask 220 to form the trenches 270a and 270b. The dashed line 290 denotes the level of the surface of the metallization mask layer 205. The trench etching is performed by a RIE process. The lateral width 225 of the TiN hard mask between the trenches defines a distance between line ends of the two conductive lines. The lateral width 225 is in the range of 8 to 15 nm. In some embodiments, the line end extensions 275a and 275b have a length in the range of 1 to 8 nm. In an exemplary embodiment, the line end extensions may be 1 nm in length.

Figure 2N:
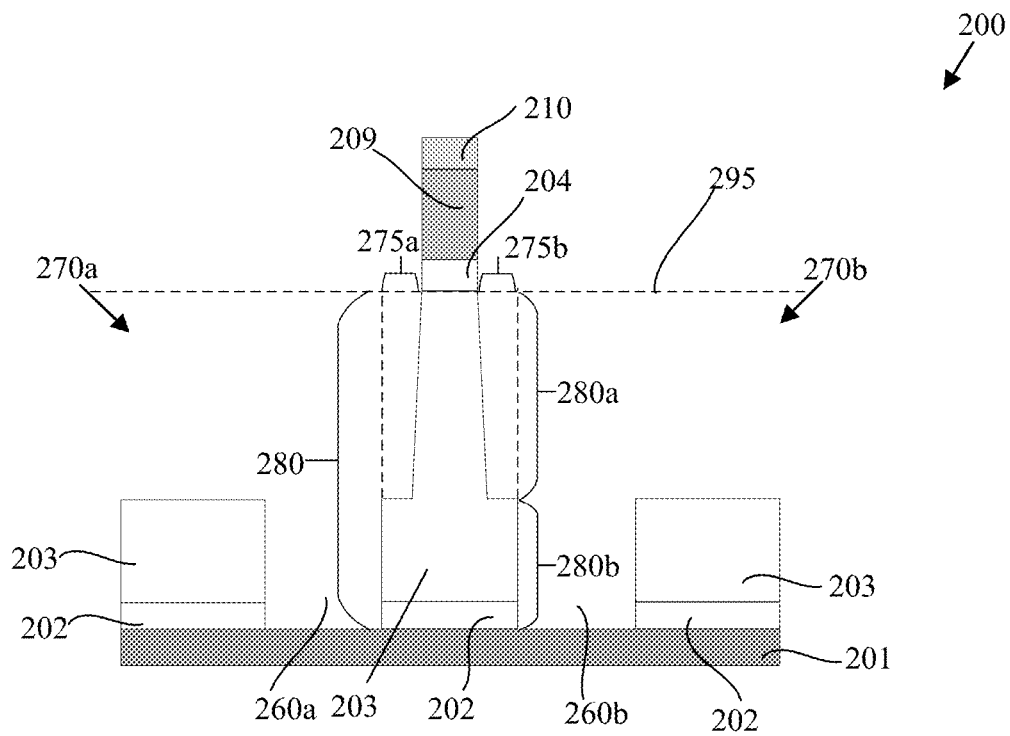

Referring to FIG. 2N, the TiN hard mask 220 is removed by a wet chemical process after etching the trenches 270a and 270b for the conductive lines. Although not shown, the metallization mask layer 205 is also removed together with the TiN hard mask 220. The dashed line 295 denotes the level of the surface of the interlayer dielectric 203 after metallization mask layer 205 removal.

Figure 2O:
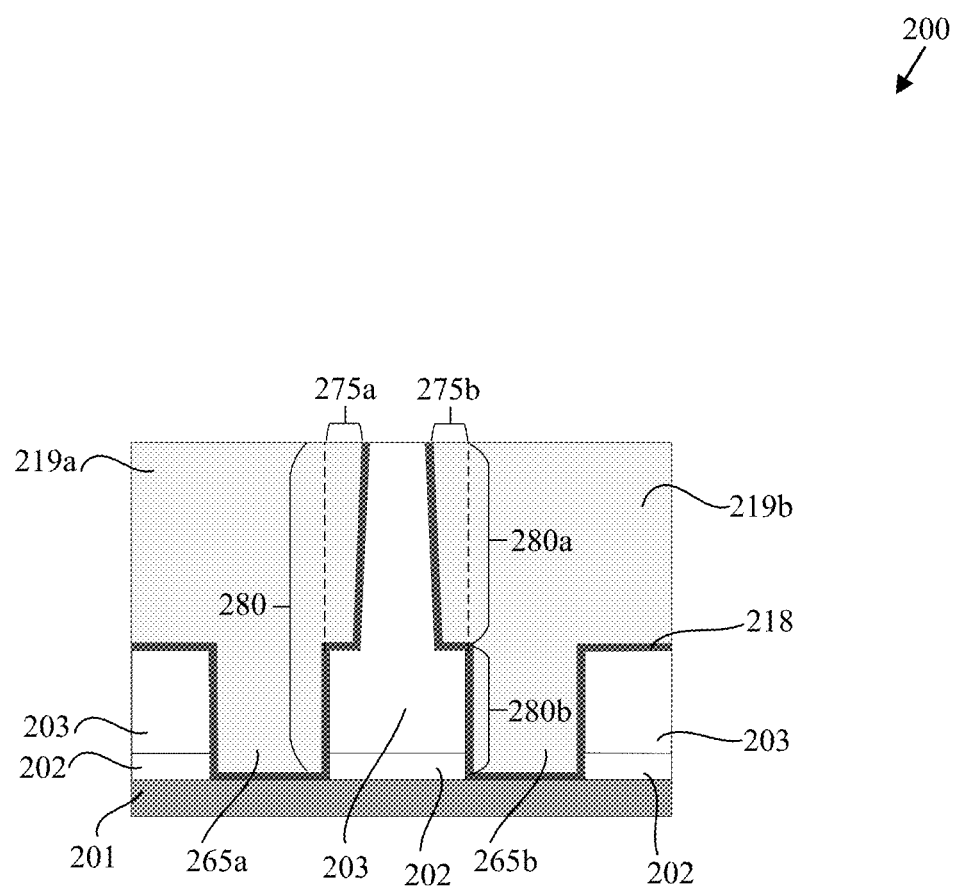

Referring to FIG. 2O, a metallization barrier layer 218 is deposited on the semiconductor device structure 200. A suitable metal such as Cu, Co, Ru or W is deposited on the barrier layer 218 to form conductive lines 219a and 219b having line end extensions 275a and 275b and interconnect vias. The conductive lines 219a and 219b are formed together with a plurality of other conductive lines on the semiconductor device structure 200. The barrier layer 218 may be TaN, Co, Ru, Ta, Ti, TiN, a combination of the aforementioned, or any other suitable material. The semiconductor device structure 200 may be planarized by a suitable process (e.g., CMP) to remove any excess metal, the sacrificial silicon nitride hard mask 204, the gap fill layer 209 and the etch stop layer 210 deposited on the gap fill layer. The upper section of the line end structure 280a separates line end extensions 275a and 275b and the lower section 280b separates the interconnect vias 265a and 265b.

Figure 3:
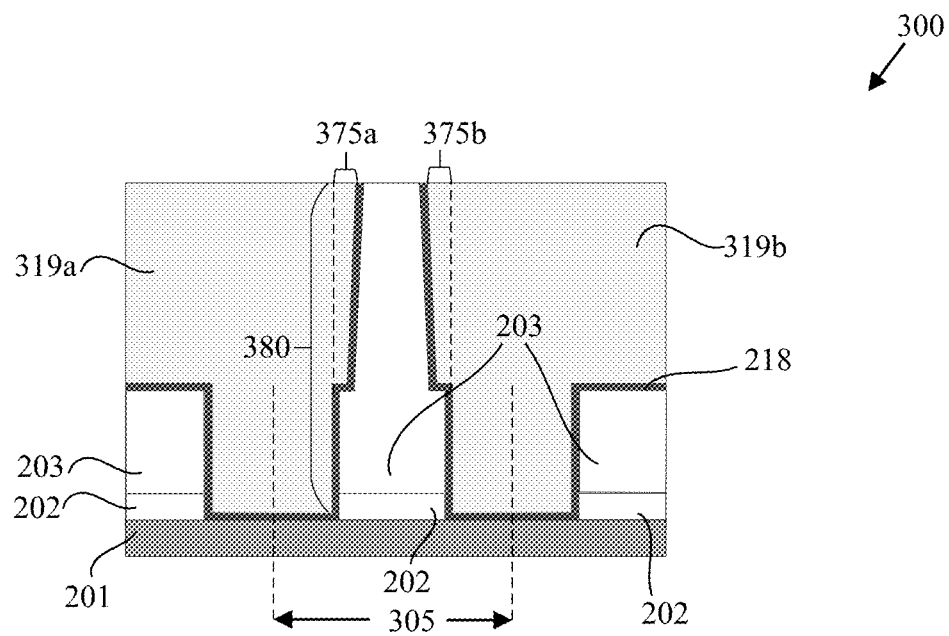
FIGS. 3 and 4 are cross-sectional views of interconnect vias formed near separate conductive line ends fabricated using different Co layer thicknesses.
Figure 4:
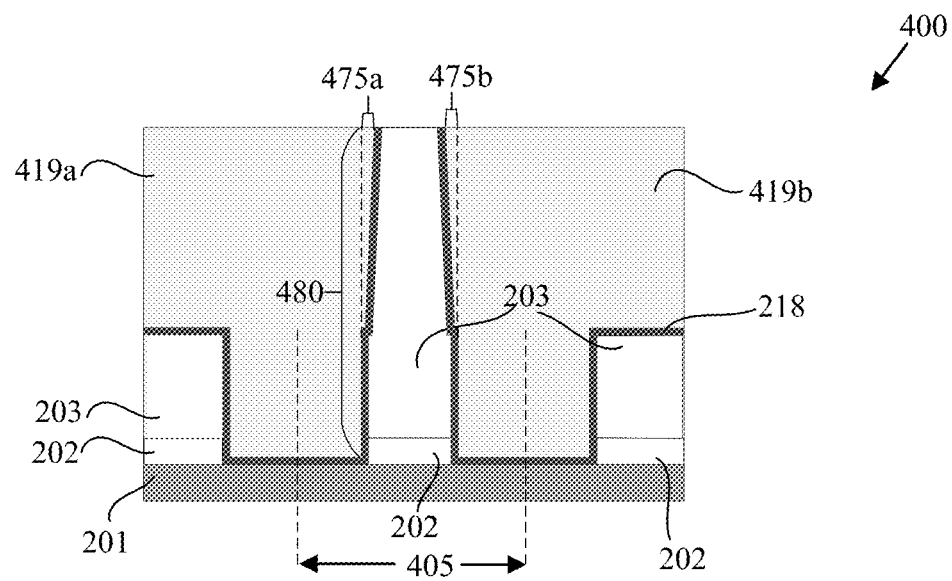

FIGS. 3 and 4 are cross-sectional views of exemplary embodiments of the line end structures 380 and 480 fabricated using 6 nm and 2 nm Co layer thicknesses, respectively. The line end structures 380 and 480 have different sized line end extensions (375a, 375b) and (475a, 475b) respectively that can be used for different types of semiconductor devices. In accordance with the present disclosure, the Co hard mask 250 may be "tuned" by varying the deposition of the Co layer thickness to determine a via center to via center spacing. The Co hard mask 250 and the TiN hard mask 220 define the length of the line end extensions to overcome the challenges in scaling. In accordance with the present disclosure, the lengths of the line end extensions in a particular embodiment (e.g., 375a and 375b) will be substantially equal. The via center to via center spacing 305 and 405 is less than 40 nm.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of semiconductor devices for integrated circuits are well-known and so, in the interest of brevity, many conventional processes are only mentioned briefly herein or omitted entirely without providing the well-known process details.

Furthermore, if a method is described herein as comprising a series of steps, the order of such steps as presented herein is not necessarily the only order in which such steps may be performed, and certain of the stated steps may possibly be omitted and/or certain other steps not described herein may possibly be added to the method. In addition, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

As will be readily apparent to those skilled in the art upon a complete reading of the present application, the semiconductor devices and methods disclosed herein may be employed in manufacturing a variety of different integrated circuit products including, but not limited to, fully-depleted silicon-on-insulator (FD-SOI) technologies, ultra-high-density (UHD) technologies, Field Effect Transistor (FET) channel devices, photo-detectors and photovoltaic devices.

What is claimed is:

1. A method of fabricating a semiconductor device structure comprising:
   depositing a layer of material on a dielectric stack and patterning the layer of material to form a hard mask;
   depositing a metal layer covering the hard mask to form a metal hard mask;
   forming vias in the dielectric stack using the metal hard mask;
   removing the metal hard mask; and
   forming trenches in the dielectric stack using the hard mask, wherein the metal hard mask and the hard mask are used to define a line end structure separating the trenches.

2. The method of claim 1, wherein the metal layer selectively deposits on the hard mask to form a uniform thickness thereon.

3. The method of claim 1, wherein the metal hard mask forms a lower section of the line end structure with a predetermined width during the forming of the vias.

4. The method of claim 1, wherein the hard mask forms an upper section of the line end structure with a predetermined width during the forming of the trenches.

5. The method of claim 1, wherein the hard mask further comprises a metal nitride or a metal oxide.

6. The method of claim 1, wherein the metal hard mask is formed of cobalt (Co) or ruthenium (Ru).

7. A method of fabricating a semiconductor device structure comprising:
   forming a dielectric stack;

depositing a layer of masking material on the dielectric stack and patterning the masking material to form a hard mask;

selectively depositing a metal layer covering the hard mask to form a metal hard mask;

forming two vias in the dielectric stack using the metal hard mask;

removing the metal hard mask; and forming two trenches in the dielectric stack using the hard mask, wherein the hard mask and the metal hard mask are used to define a line end structure separating the two trenches.

8. The method of claim 7, wherein the forming of the metal hard mask determines a via center to via center spacing and a line end extension portion in each trench for the semiconductor device structure.

9. The method of claim 7, wherein the patterning of the layer of masking material determines a length for the line end extension portion during the forming of the trenches for the semiconductor device structure.

10. The method of claim 9 further comprises:
depositing a barrier layer in the trenches and vias; and
depositing a metal layer on the barrier layer to form conductive lines having line end extension portions and interconnect vias.

11. The method of claim 7, wherein forming the dielectric stack further comprises:
forming an etch stop layer; and
depositing an interlayer dielectric on the etch stop layer; wherein the line end structure is formed in the interlayer dielectric.

12. The method of claim 11 further comprises:
depositing a planarizing mask layer over the metal hard mask;
patterning the planarizing mask layer; and
etching using the patterned planarizing mask layer and the metal hard mask to form the vias.

13. The method of claim 11, wherein forming the dielectric stack further comprises:

forming a metallization mask layer over the interlayer dielectric; and forming a plurality of patterning lines in the metallization mask layer, wherein the patterning lines are used for etching the interlayer dielectric to form the trenches for the semiconductor device structure.

14. The method of claim 13, wherein the hard mask formed from the patterning is perpendicularly aligned with and abridges at least two of the patterning lines of the metallization mask layer.

15. The method of claim 7, wherein the hard mask further comprises TiN or $TiO_x$, wherein x is a number from 1 to 3.

16. The method of claim 7, wherein the metal layer further comprises Co or Ru and has a uniform thickness between 2 nm to 10 nm.

17. A semiconductor device structure comprising:
a plurality of conductive lines and interconnect vias formed in a dielectric layer having a patterned line end structure;
the line end structure having an upper and lower sections, wherein the upper section is narrower than the lower section;
a first and second conductive lines separated by the upper section of the line end structure; and
a first and second interconnect vias separated by the lower section of the line end structure, the first and second interconnect vias having a height determined by the lower section.

18. A semiconductor device structure of claim 17, wherein the lower section of the line end structure having a lateral width that defines line end extension portions of the first and second conductive lines; and
the line end extensions are separated by the upper section of the line end structure.

19. A semiconductor device structure of claim 18, wherein the line end extension portions extend equally towards each other and have a length in the range of 1 to 8 nm.

20. A semiconductor device structure of claim 17, wherein the via center to via center spacing is less than 40 nm.

* * * * *